United States Patent
Landry et al.

(10) Patent No.: US 6,486,712 B1
(45) Date of Patent: Nov. 26, 2002

(54) PROGRAMMABLE SWITCH

(75) Inventors: Greg J. Landry, Merrimack, NH (US); Robert M. Reinschmidt, Hollis, NH (US); Timothy M. Lacey, Bedford, NH (US)

(73) Assignee: Cypress Semiconductor Corp., San Jose, CA (US)

( * ) Notice: Subject to any disclaimer, the term of this patent is extended or adjusted under 35 U.S.C. 154(b) by 8 days.

(21) Appl. No.: 09/740,106

(22) Filed: Dec. 18, 2000

(51) Int. Cl.[7] .............................................. H03K 17/00
(52) U.S. Cl. ........................................ 327/99; 327/408
(58) Field of Search ........................... 327/99, 407–411, 327/536

(56) References Cited

U.S. PATENT DOCUMENTS 5,319,254 A * 6/1994 Goetting ..................... 327/198

* cited by examiner

Primary Examiner—Kenneth B. Wells
(74) Attorney, Agent, or Firm—Suiter & Associates PC

(57) ABSTRACT

A programmable switch includes at least one or more pass transistors having a control voltage that is greater than the data path reference voltage that is selected by a corresponding pass transistor. The control voltage is provided by a higher voltage power supply than the power supply that provides the data path reference voltage. In one embodiment, the higher voltage supply is a quiet supply that is not loaded with devices that switch during normal operation of the programmable switch such as CMOS devices. In another embodiment, the power supply that provides a voltage to an I/O circuit of the probable switch is the power supply that is utilized to provide the control voltage to the pass transistors. In a particular embodiment, the pass transistors comprise higher voltage tolerant devices than other devices in the programmable device. In a particular embodiment, the higher voltage supply is at least the data path reference voltage plus the threshold voltage of the pass transistors.

17 Claims, 2 Drawing Sheets

PROGRAMMABLE SWITCH

BACKGROUND

The present invention relates generally to integrated circuits, and more specifically to switches that are capable of being programmed.

A programmable switch typically utilizes wide multiplexers consisting of n-channel pass gates in which the gate voltage of the selected path is referenced to the same power supply as the logic gates that drive the inputs and sense the outputs. The wide multiplexer circuits are used to program route connections within a programmable logic device (PLD). To minimize die area, n-channel pass gates are used as the switching elements to select a desired data signal path on which a data signal is passed. A programmable circuit such as a latch or an electrically erasable link drives the pass transistor gate voltage. The voltage provided at the gate of the pass transistor in the selected path is typically the same voltage as the power supply to the logic gates in the circuit. Since the n-channel pass transistor conduction turns off when the output reaches the power supply voltage less the threshold voltage (VPWR−VT), a p-channel transistor configured as a half-latch is typically used to restore the signal level to a full swing. However, such a circuit configuration is slow, particularly for the rising edge, which is a result of the transistor conductance decreasing as the output voltage rises. Since the n-channel pass transistor gate voltage is at VPWR, the circuit can drive the voltage only to VPWR−VT. The speed of such a circuit is limited by the channel conductance of the pass transistor, which reduces as the output voltage increases. As the total switching activity of the circuit increases, the load on the power supply increases which reduces the power supply voltage and increases the circuit delay.

SUMMARY

A programmable switch circuit is constructed with pass transistors wherein the gate of the selected path thereof is driven to a higher voltage. The higher voltage is achieved by distributing a "quiet" supply voltage that is not loaded with circuits that switch during normal operation. In this manner, the gate voltage is driven to nearly the largest value that the process can reliably allow. The gate voltage will not reduce as total switching load of the chip increases. One advantage provided by such a circuit configuration in accordance with the present invention is reduction in propagation delay resulting from an increase in the average conductance of the n-channel pass transistor and increasing the range in which the output voltage is driven, which in one embodiment is VPWR+less VT.

BRIEF DESCRIPTION OF THE DRAWINGS

The numerous advantages of the present invention may be better understood by those skilled in the art by reference to the accompanying figures in which.

DETAILED DESCRIPTION

Reference will now be made in detail to one or more embodiments of the invention, an example of which is illustrated in the accompanying drawings.

Figure 1:
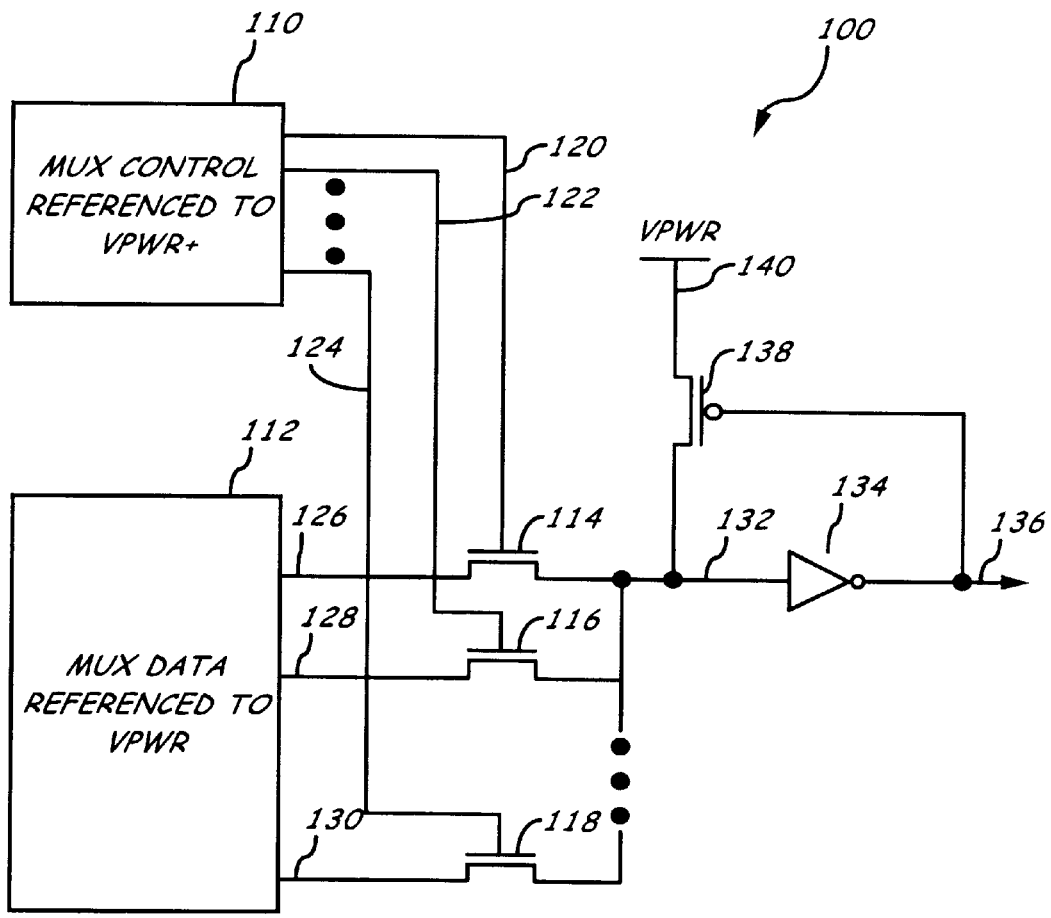
FIG. 1 is a block diagram of a programmable switch circuit in accordance with the present invention.

Referring now to FIG. 1, a block diagram of a programmable switch circuit in accordance with the present invention will be discussed. Circuit 100 includes a multiplexer data block 112 that provides multiplexer data referenced to a first voltage, VPWR. Data from multiplexer data block 112 is provided as outputs on respective data lines 126, 128, up to an Nth data line 130. The data on data lines 126, 128, and 130 is provided to respective pass transistors 114, 116, up to the Nth pass transistor 118, respectively. In one particular embodiment, pass transistors 114, 116, and 118 are n-channel MOSFET devices wherein data lines 126, 128, and 130 are coupled to the drains of respective pass transistors 114, 116, and 118. A multiplexer control block 110 provides control lines 120, 122, up to an Nth control line 124 to respective pass transistors 114, 116, and 118 for selecting respective data lines 126, 128, and 130 of multiplexer data block 112. In one embodiment of the invention as shown in FIG. 1, control lines 120, 122, and 124 are coupled to the gates of respective pass transistors 114, 116, and 118 so that a desired data line 126, 128, or 130 may be selected by applying a predetermined control voltage via a respective control line 120, 122, or 124 to turn on or off a respective pass transistor 114, 116, or 118 in accordance with the predetermined control voltage. In accordance with the present invention, multiplexer control block 110 is referenced to a second voltage, VPWR+, which has a greater value than the first voltage VPWR to which multiplexer data block 112 is referenced. The sources of pass transistors 114, 116, and 118 are coupled to node 132, which is coupled to an input of inverter 134, which in turn provides a multiplexed output 136. Output 136 is provided as a feedback signal to the gate of transistor 138, which in one embodiment is a p-channel MOSFET. The source of transistor 138 is coupled to the first reference voltage, VPWR, and the drain of transistor 138 is coupled to node 132 at the input of inverter 134. Transistor 138 is utilized in a half-latch configuration.

In accordance with the present invention, the gate of pass transistor 114, 116, or 118 is driven with the second reference voltage, VPWR+, which is greater than the first reference voltage, VPWR. In one embodiment, the higher, second reference voltage, VPWR+, is a quiet supply voltage that is not loaded with circuits that switch during normal operation of circuit 100 so that the gate voltage of selected pass transistor 114, 116, or 118 is driven with the higher, second reference voltage, VPWR+. In a preferred embodiment, the higher, second reference voltage, VPWR+, is equal to, or nearly equal to, the largest value that the fabrication process of circuit 100 can reliably allow. In accordance with the present invention, the gate voltage will not reduce as the total switching load of the chip increases since in one embodiment, the second reference voltage, VPWR+ is not loaded with switching circuits or devices. As a result of the present invention, the conductance of the pass transistor, e.g., the channel conductance, is increased by utilization of a higher gate voltage, thereby increasing the speed and the range in which the voltage at node 132 is driven by pass transistors 114, 116, and 118, which is the second reference voltage, VPWR+, less the threshold voltage, VT, of pass transistors 114, 116, and 118.

Figure 2:
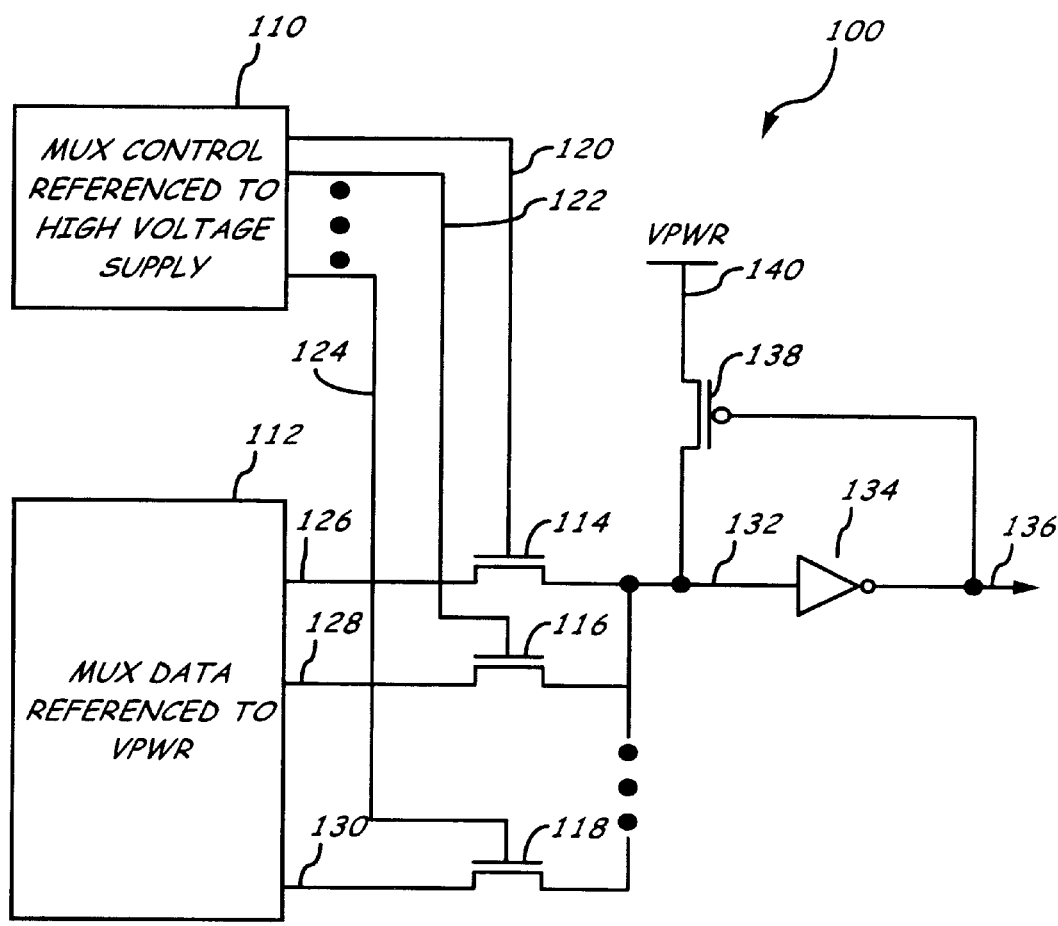
FIG. 2 is a block diagram of an alternative programmable switch circuit in accordance with the present invention.

Referring now to FIG. 2, a block diagram of an alternative programmable switch circuit in accordance with the present invention will be discussed. Circuit 100 of FIG. 2 is substantially similar to circuit 100 of FIG. 1 with the following differences. Pass transistors 114, 116, and 118 are higher voltage n-channel pass gates one having the gate connected to a higher voltage power supply for circuit 100. In one embodiment, circuit 100 is implemented in an integrated circuit that utilizes two power supply voltages, a first, lower supply voltage, and a second, higher supply voltage. In one particular embodiment, the second, higher supply voltage is at least 3.3 volts, and in another particular embodiment, the second, higher supply voltage is the higher supply voltage used in the input/output (I/O) circuits of the integrated circuit in which circuit 100 is implemented. As a result of utilizing a higher supply voltage at the gate of pass transistor 114, 116, or 118, performance of circuit is improved wherein selected pass transistor 114, 10 116, or 118 remain conducting across an entire signal swing on the respective data lines 126, 128, and 130. In such an embodiment, transistor 138 may be optional and therefore not required.

In a particular application of the present invention, circuit 100 is utilized to implement a programmable device, which provides for the selection of one or more electrical paths among many within an integrated circuit. The selection may be programmed once for a particular logic configuration and may remain unchanged during normal circuit operation, i.e., pass transistor utilized to select a given path does not switch during normal operation. Thus, the present invention is directed to, but not limited to, the following. A multiplexer is comprised of pass gates in which the gate voltage is of the pass transistors is referenced to a separate power supply that has a higher voltage than an ac loaded power supply. The higher voltage power supply is created by distributing a voltage that is not loaded by circuits that switch during normal operation. Improved speed results due to the higher pass transistor gate voltage. In another embodiment, a multiplexer is comprised of pass gates made having higher voltage transistors. The gate voltage is referenced to a separate, higher voltage power supply. The circuit speed of the multiplexer is further improved since the pass transistor conducts throughout an entire signal swing. Although transistors 114, 116, and 118 shown in FIGS. 1 and 2 are n-channel MOSFETs, and transistor 138 shown in FIGS. 1 and 2 is a p-channel MOSFET, the invention need not be limited to the particular devices shown. It is contemplated by the invention that alternative electronic devices may be substituted in lieu of the devices shown in FIGS. 1 and 2 without departing from the scope of the invention and without providing substantial change thereto.

It is believed that the programmable switch of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. An apparatus, comprising:
   a programmable logic device;
   a first power supply for providing a reference voltage to at least one or more first devices of said programmabic logic device; and
   a second power supply for providing a reference voltage to at least one or more second devices, the fist devices being switched during operation of the programmable logic device, and the second devices being unswitched during operation of the programmable logic device.

2. An apparatus as claimed in claim 1, the second power supply providing a higher reference voltage than the first power supply.

3. An apparatus as claimed in claim 1, the second power supply providing a voltage reference that is also supplied to an I/O circuit of the programmable logic device.

4. The apparatus as claimed in claim 1, further comprising a programmable switch, said programmable switch being controlled by said second power supply.

5. The apparatus as claimed in claim 4, said programmable switch including at least one or more pass transistors for engaging a corresponding programmable data path.

6. A circuit, comprising:
   a multiplexer data block for providing at least one or more data paths on which multiplexer data is capable of being provided;
   at least one or more pass transistors, each of said at least one or more pass transistors for controlling a corresponding one of said at least one or more data paths; and
   a multiplexer control block coupled to the gates of said at least one or more pass transistors for controlling the selection of the multiplexer data provided by said multiplexer data block according to a control voltage applied to a selected gate of said at least one or more pass transistors;
   said control voltage being higher than the reference voltage of said at least one or more data paths.

7. A circuit as claimed in claim 6, said control voltage being at least the reference voltage of said at least one or more data paths plus a threshold voltage of said at least one or more pass transistors.

8. A circuit as claimed in claim 7, said at least one or more pass transistors being capable of operating with a higher voltage.

9. The circuit as claimed in claim 8, wherein said at least one or more pass transistors are tolerant of a higher voltage than internal CMOS logic.

10. The circuit as claimed in claim 6, wherein said control voltage is at least 3.3 volts.

11. The circuit as claimed in claim 6, wherein said at least one or more pass transistors are n-channel MOSFET devices.

12. A method of reducing propagation delay in a programmable switch, comprising.
   (a) supplying a reference voltage to one or more data paths, said one or more paths providing multiplexer data referenced to said reference voltage; and
   (b) supplying a second voltage to a gate of one pass transistor of at least one or more pass transistors for selecting a corresponding data path, wherein said second voltage is higher than said reference voltage.

13. The method as claimed in claim 12, said second voltage being at least the voltage of said reference voltage plus a threshold voltage of said at least one or more pass transistors.

14. The method as claimed in claim 12, said second voltage of said at least one or more pass transistors not being loaded by a device that is switched during normal operation of the programmable switch.

15. The method as claimed in claim 12, said at least one or more pass transistors being tolerant of a higher voltage than at least one or more CMOS logic devices internal to the programmable switch.

16. A programmable switch, comprising:
   (a) means for transferring data from a multiplexer data block; and
   (b) means for selecting a path to send data via said transferring means; wherein said transferring means is powered by a first power supply, said selecting means being powered by a second power supply, wherein a voltage provided by said second power supply is greater than the voltage supplied by said first power supply.

17. The programmable switch as claimed in claim 16, wherein said second power supply provides a voltage of at least 3.3 volts.

* * * * *